United States Patent [19]

Tsuboi

[11] Patent Number: 5,414,375

[45] Date of Patent: May 9, 1995

[54] CMOS OUTPUT CIRCUIT WITH OPEN DRAIN TRANSISTOR

[75] Inventor: Toshihide Tsuboi, Tokyo, Japan

[73] Assignee: NEC Corporation, Tokyo, Japan

[21] Appl. No.: 114,245

[22] Filed: Sep. 1, 1993

[30] Foreign Application Priority Data

Sep. 3, 1992 [JP] Japan .................. 4-235766

[51] Int. Cl.6 .................. H03K 17/16; H03K 19/0175
[52] U.S. Cl. ..................... 326/30; 326/68; 326/83; 326/58
[58] Field of Search ............... 307/451, 475, 473, 443; 326/30, 68, 83, 58

[56] References Cited

U.S. PATENT DOCUMENTS

| | | | |
|---|---|---|---|
| 4,707,625 | 11/1987 | Yanagisawa | 307/443 |
| 4,827,159 | 5/1989 | Naganuma | 307/451 |
| 4,947,063 | 8/1990 | O'Shaughnessy et al. | 307/443 |
| 4,972,100 | 11/1990 | Lim et al. | 307/451 |
| 5,122,691 | 6/1992 | Balakrishnan | 307/475 |

Primary Examiner—David R. Hudspeth
Assistant Examiner—Richard Roseen
Attorney, Agent, or Firm—Sughrue, Mion, Zinn, Macpeak & Seas

[57] ABSTRACT

A semiconductor integrated circuit having a complementary MOS structure, comprises an output buffer control portion of a complementary MOS inverter structure for inputting a logical output of an internal logic circuit, an output buffering MOS transistor of a first conductive type for receiving output of the output buffer control portion as a gate input and externally outputting a logical output, and level shifting means for causing level shift of a source potential of a second conductive type MOS transistor to be lower than a power source potential in a magnitude corresponding to a threshold value of the second conductive type MOS transistor.

8 Claims, 7 Drawing Sheets

CMOS OUTPUT CIRCUIT WITH OPEN DRAIN TRANSISTOR

BACKGROUND OF THE INVENTION

The present invention relates generally to an output circuit for a semiconductor integrated circuit. More specifically, the invention relates to an output circuit for a semiconductor logical integrated circuit having a complementary MOS (C-MOS) structure.

One example of an output circuit of a semiconductor logical integrated circuit of C-MOS structure is illustrated in FIG. 6. A logical output 101 of an internal logic circuit 1 becomes a gate input of an N-channel MOS transistor 23 for output buffering via an output buffer control portion 2. A logical output 103 of the circuit is externally output through an open drain of the transistor 23.

The output buffer control portion 2 has a C-MOS inverter structure and comprises P-channel MOS transistor 21 and N-channel MOS transistor 22. Gates of both transistors 21 and 22 are commonly connected so that the logical output 101 of the internal logic circuit 1 is applied thereto. Drains of both transistors 21 and 22 are commonly connected to form a gate input 102 of the transistor 23 for output buffering. This output buffer control portion 2 is provided between a high power source potential $V_{DD}$ and a low power source potential (ground potential). The source of the output buffering transistor 23 is grounded.

With reference to FIG. 7, an operation upon rising up of a power source of the circuit of FIG. 6 will be discussed. Once the power source voltage is risen to a potential, at which the internal logic circuit 1 operates stably (at a timing $t_1$), the level of the output signal 101 of the internal logic circuit 1 is initially set at the power source potential.

Generally, in the C-MOS logic circuit, when the power source voltage is higher than a level of a sum of a threshold value $V_{TN}$ of the N-channel MOS transistor and a threshold value $V_{TP}$ of the P-channel MOS transistor, the C-MOS logic circuit may operate stably, and otherwise, the stable operation of the C-MOS logic circuit cannot be obtained as a delay period of the circuit becomes large or for other reason. Accordingly, in FIG. 7, the timing where the C-MOS logic circuit operates stable, is indicated as $t_1$. The power source voltage level at the timing $t_1$ is $(V_{TN}+V_{TP})$.

It should be noted that, in FIG. 7, (a) shows a power source voltage variation, (b) shows an internal condition of the internal logic circuit 1, (c) shows a voltage variation of the output signal 101, (d) shows a voltage variation of the output signal 102 of the output buffer control portion 2, and (e) shows a condition of the logical output signal 103 of the circuit.

During a period between a ON-set of the power supply at a timing $t_0$ to the timing $t_1$, the internal logic circuit 1 is astable. Therefore, the voltage level of the output signal 101 is indeterminable. Consequently, the output signal 102 output from the output buffer control portion 2 is also indeterminable. As a result, the drain output 103 of the output buffering transistor 23 is also indeterminable.

Here, when the output signal 101 is the power source voltage $V_{DD}$, the N-channel MOS transistor 22 is ON and the output buffering N-channel MOS transistor 23 is OFF so that the output 103 is in high impedance state. Conversely, when the output signal 101 is in the grounding level, the output buffering transistor 23 is ON so that the output 103 becomes the grounding level (low level).

Accordingly, after the power source voltage reaches the potential, at which the internal logic circuit 1 operates stably, the output signal 101 becomes equal to the power source voltage. Thus, the output signal 102 of the output buffer control portion 2 becomes the grounding level. Therefore, the output buffering transistor 23 becomes OFF. Accordingly, the drain output 103 of the transistor 23 becomes high impedance state.

In such output circuit, during the period from the timing $t_0$, at which the power source voltage is turned ON, and the timing $t_1$ at which the power source voltage level reaches the potential to stably operate the internal logic circuit 1, the level of the output signal 101 is held unstable. Accordingly, during rising transition of the power source voltage, if the output signal 101 is the grounding level before the logical output 103 becomes high impedance state as originally expected (before $t_1$), P-channel MOS transistor 21 can be turned ON (during a period of $t_x \sim t_1$). Then, the level of the output signal 102 is pulled up according to rising of the power source voltage level. As a result, the output buffering N-channel MOS transistor 23 is turned ON. That makes it difficult to maintain the high impedance state of the logical output 103 and thus to become low level. In such state, when a circuit component which is responsive to the voltage lower than or equal to the voltage, at which the internal logical circuit can operate stably, is connected to the logical output 103, such circuit component becomes active in response to the low level of the output 103 to be a cause of malfunction.

Particularly, when the circuit component connected to the logical output 103 is employed to shutting off the power source, shutting off of the power source is taken place in response to low level of the output 103 to cause a critical problem to make rising of the power source impossible.

SUMMARY OF THE INVENTION

Therefore, it is an object of the present invention to provide an output circuit for a semiconductor integrated circuit which can certainly maintain high impedance state of a circuit output until a voltage to stably operate an internal logic circuit is reached during rising of the power source voltage.

According to one aspect of the invention, a semiconductor integrated circuit having a complementary MOS structure, comprises:

an output buffer control portion of a complementary MOS inverter structure for inputting a logical output of an internal logic circuit;

an output buffering MOS transistor of a first conductive type for receiving output of the output buffer control portion as a gate input and externally outputting a logical output from a drain; and level shifting means for causing level shift of a source potential of a second conductive type MOS transistor in said output buffer control portion to be lower than a power source potential in a magnitude corresponding to a threshold value of the second conductive type MOS transistor.

According to another aspect of the invention, a semiconductor integrated circuit having a complementary MOS structure, comprises:

first and second output buffer control portions of a complementary MOS inverter structure for inputting mutually opposite polarities of logical outputs of an internal logic circuit;

mutually opposite conductive types of first and second output buffering MOS transistors for receiving respective outputs of the first and second output buffer control portions as gate inputs and having drains connected in common for externally outputting a logical output;

first level shifting means for causing level shift of a source potential of a first opposite conductive type MOS transistor in the first output buffer control portion having opposite conductive type to that of the first output buffering MOS transistor to be lower than a power source potential in a magnitude corresponding to a threshold value of the first opposite conductive type MOS transistor; and second level shifting means for causing level shift of a source potential of a second opposite conductive type MOS transistor in the second output buffer control portion having opposite conductive type to that of the second output buffering MOS transistor to be lower than a power source potential in a magnitude corresponding to a threshold value of the second opposite conductive type MOS transistor.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

Figure 1:
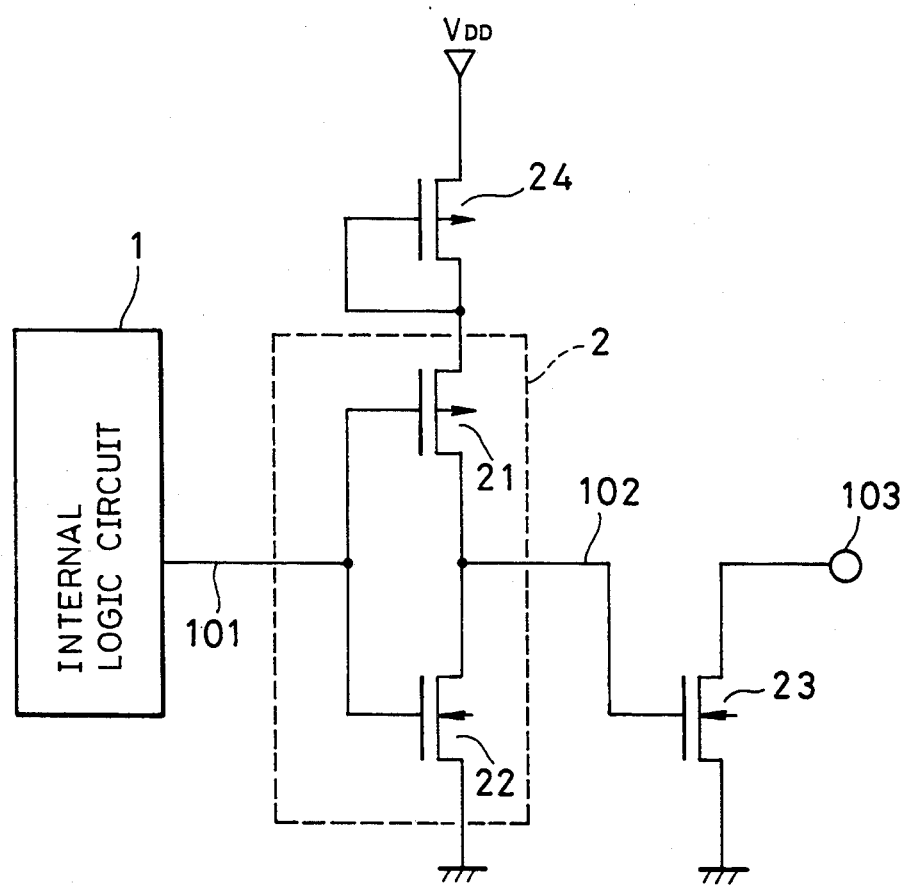
FIG. 1 is a circuit diagram of the first embodiment of the present invention.
Figure 6:
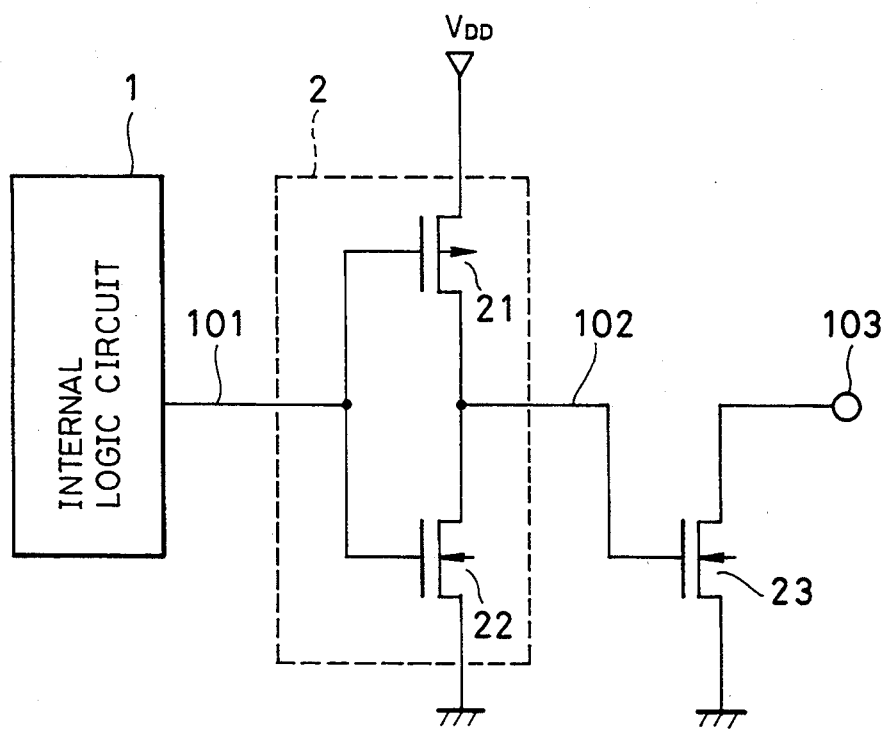
FIG. 6 is a circuit diagram of one example of the conventional output circuit.
Figure 7:
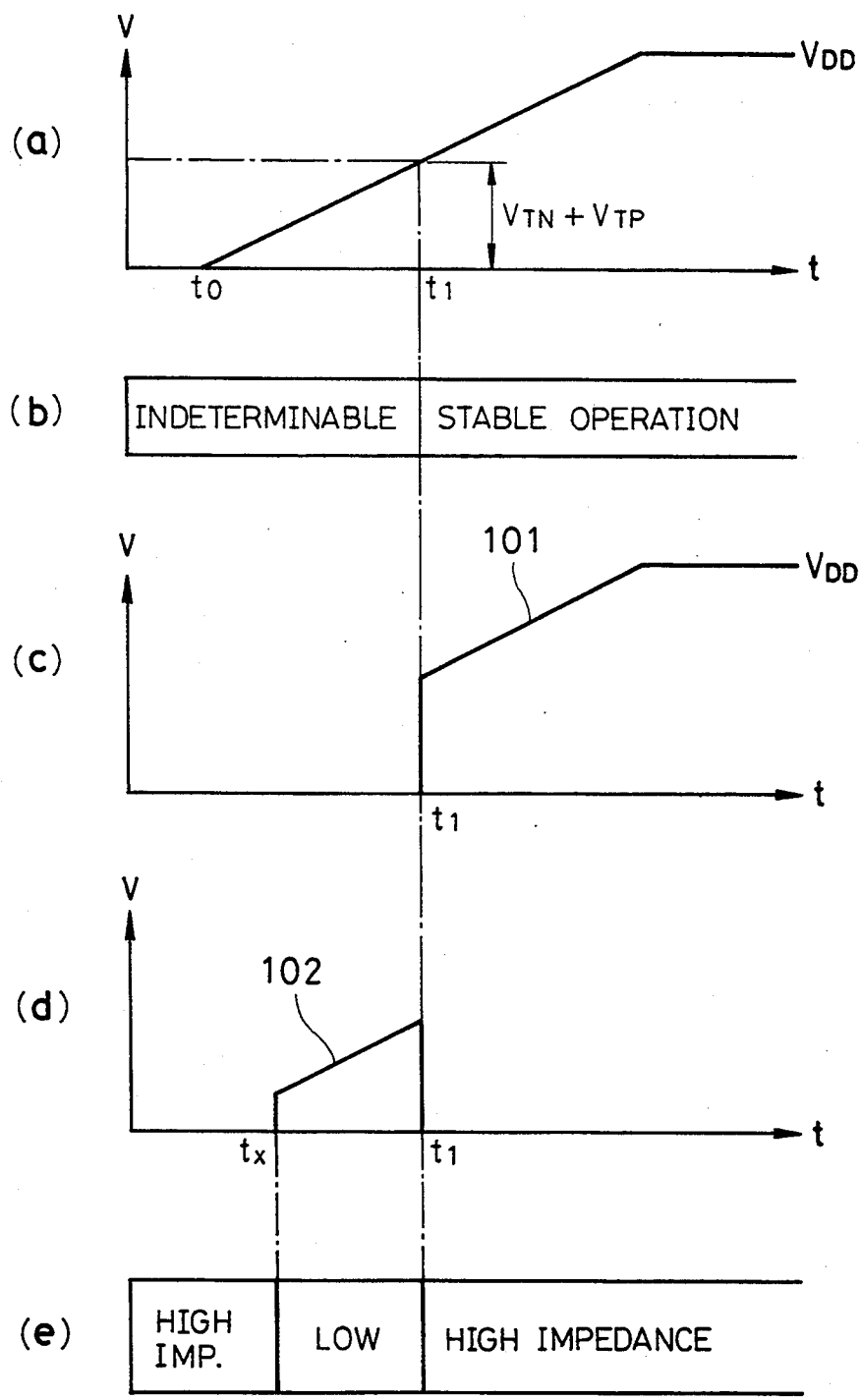
FIGS. 7(a)-7(e) are charts showing variation of potential levels at various parts showing the operation of circuit of FIG. 6.

In FIG. 1, the like parts will be represented by like reference numerals to FIG. 6. An output signal 101 of an internal logic circuit 1 is input to an output buffer control portion 2 of a C-MOS inverter structure. The output 102 of the output buffer control portion 2 forms a gate input of an N-channel MOS transistor 23 of an open drain structure. The drain output of the transistor 23 serves as a circuit output 103. The source of the transistor 23 is grounded.

Furthermore, in the shown embodiment, in order to cause level shifting of a source potential of a P-channel MOS transistor 21 in a magnitude of $V_{TP}$ (a threshold value of the P-channel transistor), a level shifting P-channel MOS transistor 24 is provided. The transistor 24 is provided between a high power source potential ($V_{DD}$) and the source of the P-channel MOS transistor 21. The source of the P-channel MOS transistor 24 is connected to the high power source voltage and the gate and drain are commonly connected at the source of the transistor 21.

FIGS. 2(a)–2(f) show signal waveforms at various portions for explaining the operation of the circuit of FIG. 1, in which (a) shows a power source voltage variation, (b) shows an internal condition of the internal logic circuit 1, (c) shows a voltage variation of the output signal 101, (d) shows a source potential variation of the P-channel MOS transistor 21, (e) shows a voltage variation of the output signal 102 of the output buffer control portion 2, and (f) shows a condition of the logical output signal 103 of the circuit.

Even in the shown embodiment, at a timing $t_1$, at which the power source potential reaches a potential to stably operate the internal logic circuit 1 during rising of the power source voltage, the potential of the output signal 101 of the internal logic circuit 1 is initially set at the power source potential level.

Since operation is differentiated depending upon which of the threshold value $V_{TP}$ of the P-channel MOS transistor 21 and a threshold value $V_{TN}$ of an N-channel MOS transistor 22 is greater, discussion will be given with respect to FIGS. 2(a)–2(f) in case of $V_{TN} \geq V_{TP}$.

During the period between the timing $t_0$ at ON-set of the power source voltage to a timing $t_1$ reaching at $(V_{TN}+V_{TP})$, the potential of the output signal 101 of the internal logical circuit 1 is indeterminable. Since the P-channel MOS transistor 24 may not be turned ON unless a gate-source potential difference becomes greater than $V_{TP}$, the transistor 24 turns ON only when the power source voltage reaches $V_{TP}$ at a timing $t_y$. Thereafter, the drain potential of the transistor 24, namely, the source potential of the P-channel MOS transistor 21 is level shifted to be constantly lower than the power source voltage in the level of $V_{TP}$, as shown in FIG. 2(d).

Figure 2:
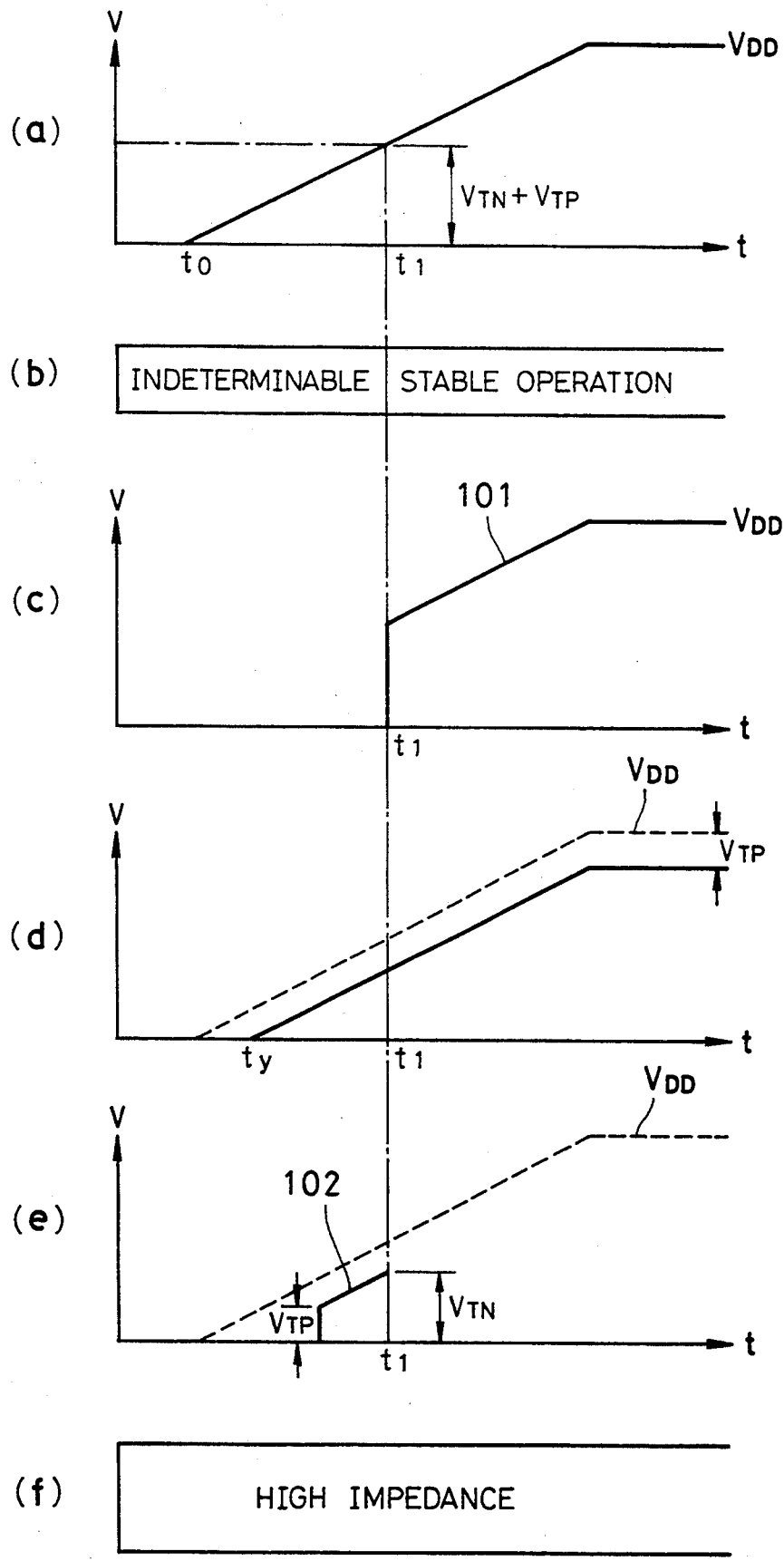
FIGS. 2(a) to 2(f) are charts of variation of potential levels at various parts showing one example of operation of the circuit of FIG. 1.
Figure 3:
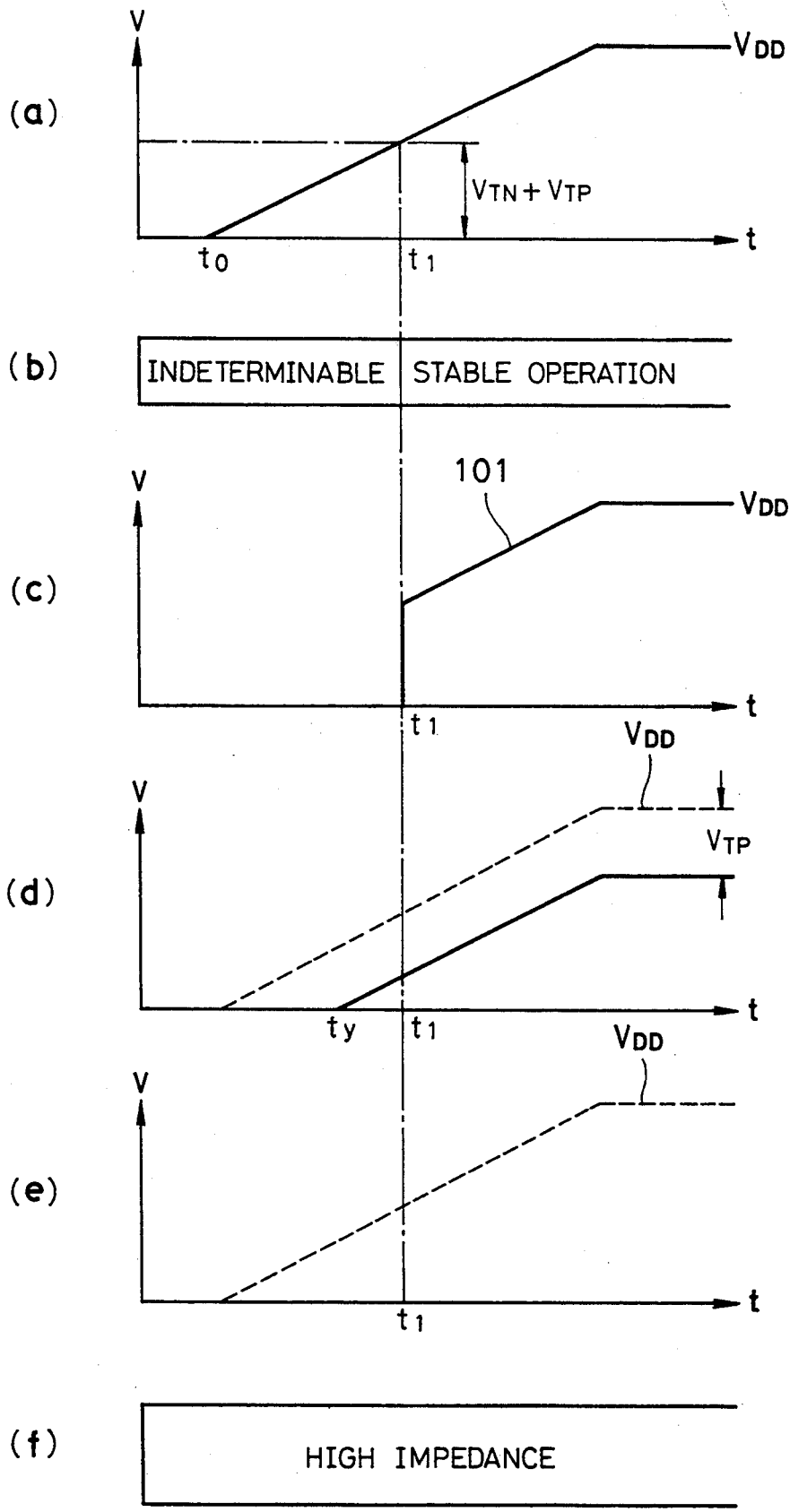
FIGS. 3(a) to 3(f) are charts of variation of potential levels at various parts showing another example of operation of the circuit of FIG. 1.

Accordingly, during a period between the timing $t_y$ to the timing $t_1$, even if the P-channel MOS transistor 21 is turned ON in response to grounding level of the output signal 101, the potential of the output signal 102 is held a potential lower than the power source potential in a magnitude of $V_{TP}$ as shown in FIG. 2(e). Here, the output buffering N-channel MOS transistor 23 will never turn ON unless the gate-source potential difference becomes higher than or equal to $V_{TN}$. At this time, the gate potential of the transistor 23 is the potential of the output signal 102, which potential is held lower than the power source potential for $V_{TP}$. In order to turn ON the transistor 23, the power source potential must be higher than $(V_{TN}+V_{TP})$. Therefore, during the period between the timing $t_y$ to the timing $t_1$, the transistor 23 will never turn ON even when the output signal 101 of the internal logic circuit 1 falls into the grounding level.

When the power source voltage becomes $(V_{TN}+V_{TP})$ at the timing $t_1$, the internal logic circuit 1 becomes stable and the output signal 101 is initialized to the power source potential. Therefore, since the N-channel MOS transistor 22 is turned ON only at the timing $t_1$, the output signal 102 becomes low level. As a result, the output buffering N-channel MOS transistor 23 is maintained ON to maintain the drain output 103 at high impedance state.

Next, discussion will be given for the rising operation of the power source potential in case of $V_{TN} \leq V_{TP}$ with reference to FIGS. 3(a)–3(f) which show potential variations at the same portions to those of FIGS. 2(a)–2(f).

Even in the shown embodiment, the source potential of the P-channel MOS transistor has the potential constantly lower than the power source potential in the magnitude of $V_{TP}$, as shown in FIG. 2(d). Here, in order to turn the P-channel MOS transistor 21, the gate-source potential difference must be greater than $V_{TP}$. Accordingly, for turning ON the transistor 21 and for making the output signal 102 higher than the grounding level, the power source voltage must be higher than $2 \times V_{TP}$.

Here, since $V_{TN} < V_{TP}$, $2 \times V_{TP}$ is greater than $(V_{TN} + V_{TP})$. Namely, the output signal 102 will never become higher than the grounding level unless the power source potential becomes higher than $2 \times V_{TP}$ higher than $(V_{TN} + V_{TP})$ at which the internal logic circuit 1 operates stably. Accordingly, even when the output signal 101 of the internal logic circuit 1 is unstable to become the grounding level, the output buffering N-channel MOS transistor 23 will never turn ON. Therefore, the circuit output 103 can be maintained at high impedance state.

Figure 4:
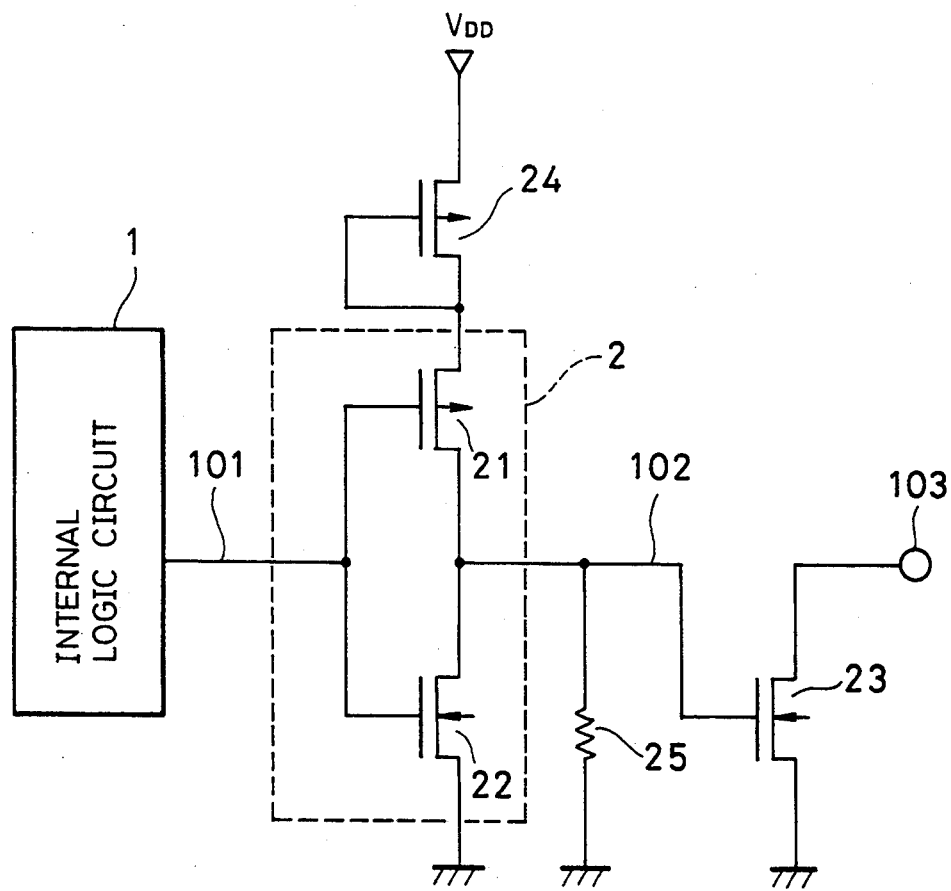
FIG. 4 is a circuit diagram of the second embodiment of the present invention.

FIG. 4 is a circuit diagram of the second embodiment of the present invention, in which the like components to those of FIG. 1 are represented by like reference numerals. In the shown embodiment, a pull down resistor 25 is added between the output 102 of the output buffer control portion 2 and the ground. The resistance of the resistor 25 is selected to be much greater than the impedances of the P-channel MOS transistors 21 and 24.

In the shown embodiment, when the power source voltage is varied between the grounding level and the predetermined potential $V_{DD}$ for a plurality of times within a short period, a residual charge on the line of the output signal 102 of the output buffer control portion 2 can be discharged through the resistor 25 for removing. Therefore, in the application set forth above, inadvertent turning on of the output buffering transistor 23 due to the residual charge can be avoided.

Figure 5:
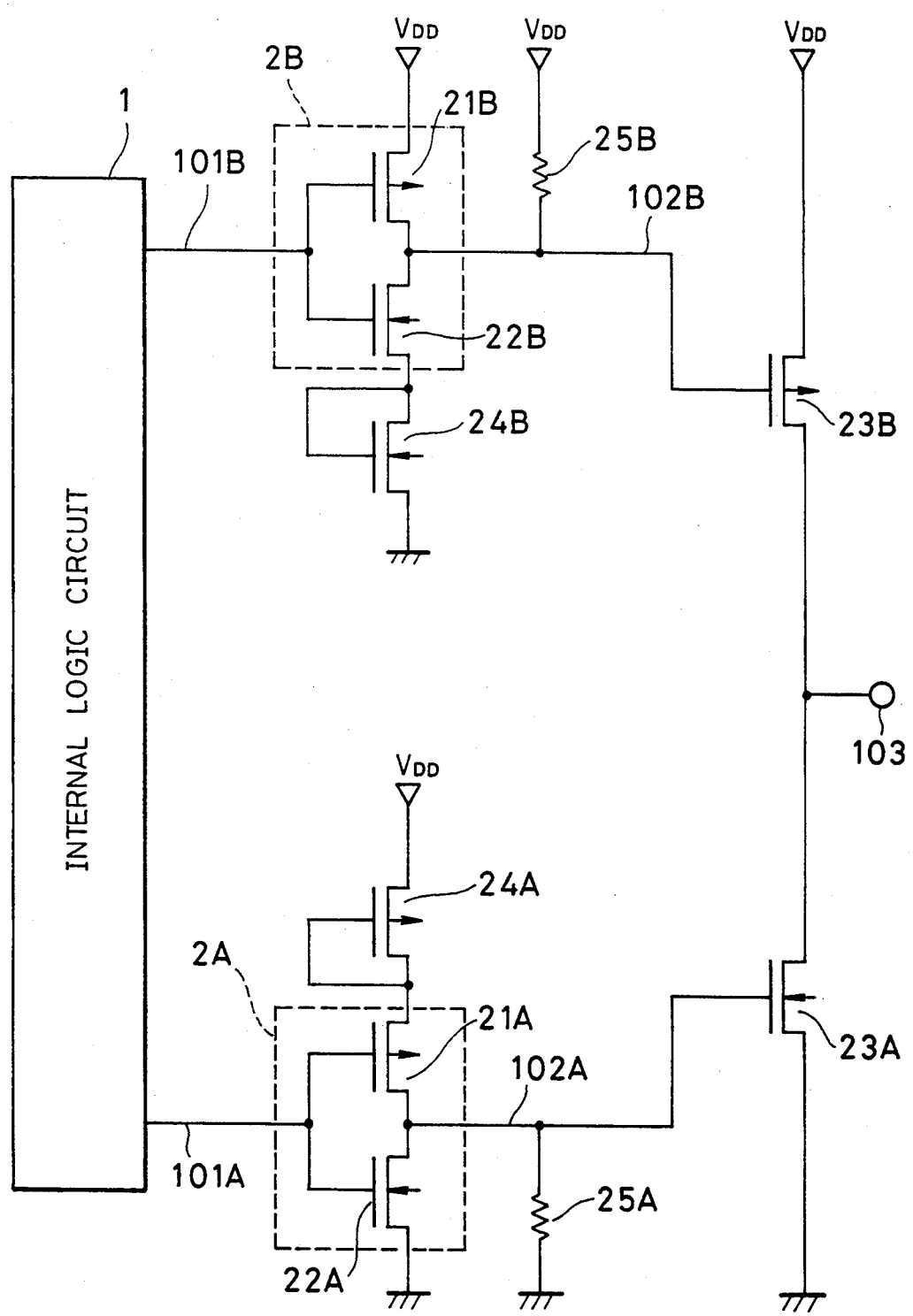
FIG. 5 is a circuit diagram of the third embodiment of the invention.

FIG. 5 is a circuit diagram of the third embodiment of the present invention, in which like represent numerals represent like components in FIGS. 1 and 4. The shown embodiment is applied for the circuit, in which the internal logic circuit 1 outputs a pair of logic signals 101A and 101B having opposite polarities. For the logic signals 101A and 101B, the shown embodiment is provided with output buffer control portions 2A and 2B and output buffering transistors 23A and 23B. Both transistors 23A and 23B have a common drain connected to the circuit output 103. With the construction set forth above, the output buffer is formed into so-called push-pull structure.

Therefore, the output buffer control portion 2A corresponding to the logical output 101A and the output buffer control portion 2B corresponding to the opposite polarity of logical output 101B are provided corresponding transistors of mutually opposite conductive type to form a complementary circuit construction.

On the other hand, concerning a charge discharging resistor, a resistor 25A is disposed between the output signal 102A and the grounding level to serve as a pull down resistor. Conversely, a resistor 25B is disposed between the output signal 102B and the high power source voltage $V_{DD}$ to serve as a pull up resistor.

As set forth above, according to the present invention, since the level shifting MOS element is provided between the output buffer control portion and the power source potential for causing level shift of the power source potential at a predetermined magnitude, the grounding level will never be output inadvertently and thus certainly maintained at high impedance state until the power source potential reaches the potential, at which the internal logic circuit can be operated stably, during rising of the power source potential. Therefore, malfunction upon ON-set of the power source can be successfully prevented.

What is claimed is:

1. A semiconductor integrated circuit having a complementary MOS structure, comprising:

an output buffer control portion of a complementary MOS inverter structure for inputting a logical output of an internal logic circuit having an input terminal supplied with said logical output of the internal logic circuit, an output terminal, a first MOS transistor of a first conductive type having a gate connected to said input terminal and a drain connected to said output terminal, and a second MOS transistor of a second conductive type having a gate connected to said input terminal and a drain connected to said output terminal;

an output buffering MOS transistor of said first conductive type having a gate connected to said output terminal and a drain externally outputting a logical output;

a level shifting means connected between a power source and a source of said second MOS transistor, for causing level shift of a source potential of said second MOS transistor in said output buffer control portion to be lower than a potential of said power source in a magnitude corresponding to a threshold value of said second MOS transistor.

2. A semiconductor integrated circuit as set forth in claim 1, wherein said level shifting means comprises a second conductive type MOS transistor, gate and drain thereof are connected in common.

3. A semiconductor integrated circuit as set forth in claim 2, wherein said first conductive type is N-channel type and said second conductive type is P-channel type, and the power source potential is high power source potential.

4. A semiconductor integrated circuit as set forth in claim 3, wherein a pull down resistor is provided between the gate of said output buffering MOS transistor and a low power source potential.

5. A semiconductor integrated circuit as set forth in claim 2, wherein said first conductive type is P-channel type, said second conductive type is N-channel type and said power source potential is low power source potential.

6. A semiconductor integrated circuit as set forth in claim 5, wherein a pull up resistor is provided between the gate of said output buffering MOS transistor and the high power source potential.

7. A semiconductor integrated circuit having a complementary MOS structure, comprising:

first and second output buffer control portions of a complementary MOS inverter structure for inputting mutually opposite polarities of logical outputs of an internal logic circuit;

said first output buffer control portion comprising a first input terminal supplied with one of said logical outputs of the internal logic circuit, a first output terminal, a first MOS transistor of a first conductive type having a gate connected to said first input terminal and a drain connected to said first output terminal, and a second MOS transistor of a second conductive type having a gate connected to said first input terminal and a drain connected to said first output terminal;

said second output buffer control portion comprising a second input terminal supplied with the other of said logical outputs of the internal logic circuit, a second output terminal, a third MOS transistor of said first conductive type having a gate connected to said second input terminal and a drain connected to said second output terminal, and a fourth MOS transistor of said second conductive type having a gate connected to said second input terminal and a drain connected to said second output terminal;

mutually opposite conductive types of first and second output buffering MOS transistors having gates connected to said first and second output terminals, respectively, and drains connected in common for externally outputting a logical output;

a first level shifting means connected between a first power source and a source of said second MOS transistor, for causing level shift of a source potential of said second MOS transistor to be lower than a potential of said first power source in a magnitude corresponding to a threshold value of said second MOS transistor; and a second level shifting means connected between a second power source and a source of said third MOS transistor, for causing level shift of a source potential of said third MOS transistor to be higher than a potential of said second power source in a magnitude corresponding to a threshold value of said third MOS transistor.

8. A semiconductor integrated circuit set forth in claim 7, wherein said first level shifting means comprises a MOS transistor of said second conductive type, gate and drain thereof are connected in common, and said second level shifting means comprises a MOS transistor of said first conductive type, gate and drain thereof are connected in common.

* * * * *